(12) United States Patent
Miyazawa (10) Patent No.: US 6,730,173 B2
(45) Date of Patent: May 4, 2004

(54) METHOD AND APPARATUS OF MANUFACTURING ELECTRONIC CIRCUIT MODULE, AND METHOD AND APPARATUS OF MANUFACTURING SEMICONDUCTOR MODULE

(75) Inventor: Ikuya Miyazawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/079,432

(22) Filed: Feb. 22, 2002

(65) Prior Publication Data

US 2002/0182842 A1 Dec. 5, 2002

(30) Foreign Application Priority Data

Mar. 28, 2001 (JP) ........................................ 2001-091914

(51) Int. Cl.$^7$ ............................................... B05C 11/00
(52) U.S. Cl. ...................... 118/666; 118/66; 118/712; 228/40
(58) Field of Search ............................... 228/36, 37, 40, 228/179.1, 260; 118/72, 58, 712, 666, 407, 62, 66; 427/314, 595, 592, 591, 319, 325

(56) References Cited

U.S. PATENT DOCUMENTS

| | | | |
|---|---|---|---|
| 3,604,611 A | * 9/1971 | Lamberty | ................... 228/37 |
| 4,698,774 A | * 10/1987 | Abe et al. | ..................... 228/43 |
| 4,807,794 A | * 2/1989 | Hess | ........................... 228/37 |
| 5,356,066 A | 10/1994 | Yamada | |
| 5,381,954 A | 1/1995 | Tokizaki | |
| 5,439,160 A | 8/1995 | Marcantonio | |
| 5,560,537 A | * 10/1996 | Sadler et al. | .................. 228/37 |
| 2002/0130163 A1 | * 9/2002 | Miyazawa | ............. 228/180.21 |

FOREIGN PATENT DOCUMENTS

| | | |
|---|---|---|
| JP | A 8-116167 | 5/1996 |
| JP | 2002-204060 | 7/2002 |
| TW | 69131 | 8/1985 |

* cited by examiner

Primary Examiner—Brenda A. Lamb
(74) Attorney, Agent, or Firm—Oliff & Berridge, PLC (57) ABSTRACT

A method of manufacturing an electronic circuit module includes flow soldering including preheating an interconnect substrate on which an electronic part is placed, and supplying molten solder to a first surface of the interconnect substrate, whereby the first surface is heated to a specific temperature, wherein the interconnect substrate is heated by the preheating so that a difference between a temperature of the first surface immediately before supplying the molten solder and the specific temperature at the time of supplying the molten solder is 100° C. or less.

12 Claims, 4 Drawing Sheets

METHOD AND APPARATUS OF MANUFACTURING ELECTRONIC CIRCUIT MODULE, AND METHOD AND APPARATUS OF MANUFACTURING SEMICONDUCTOR MODULE

Japanese Patent Application No. 2001-91914, filed on Mar. 28, 2001, is hereby incorporated by reference in its entirety.

BACKGROUND OF THE INVENTION

The present invention relates to a method and an apparatus of manufacturing an electronic circuit module, and a method and an apparatus of manufacturing a semiconductor module.

A method of bonding a plurality of electronic parts to an interconnect substrate by combining reflow soldering and flow soldering is known. In this case, one surface of the interconnect substrate is generally subjected to reflow soldering, and the other surface is subjected to flow soldering thereafter.

In flow soldering, molten solder is supplied to the interconnect substrate. The interconnect substrate is heated instantaneously by the molten solder, whereby the temperature of the interconnect substrate is increased. This causes a large difference in temperature between two surfaces of the interconnect substrate, whereby the interconnect substrate may be warped. As a result, reflow soldered connection sections of the electronic parts may be removed from the interconnect substrate.

SUMMARY OF THE INVENTION

A method of manufacturing an electronic circuit module according to the present invention comprises flow soldering which comprises preheating an interconnect substrate on which an electronic part is placed, and supplying molten solder to a first surface of the interconnect substrate, whereby the first surface is heated to a specific temperature, wherein the interconnect substrate is heated by the preheating so that a difference between a temperature of the first surface immediately before supplying the molten solder and the specific temperature at the time of supplying the molten solder is 100° C. or less.

A method of manufacturing a semiconductor module according to the present invention comprises the above method of manufacturing an electronic circuit module, wherein the electronic part is a semiconductor device.

An apparatus of manufacturing an electronic circuit module according to the present invention comprises:

a preheating section which includes a heater for heating an interconnect substrate on which an electronic part is placed, and a solder supplying section which supplies molten solder to a first surface of the interconnect substrate, whereby the first surface is heated to a specific temperature, wherein the heater heats the interconnect substrate so that a difference between a temperature of the first surface immediately before supplying the molten solder and the specific temperature at a time of supplying the molten solder is 100° C. or less.

An apparatus of manufacturing a semiconductor module according to the present invention comprises the above apparatus of manufacturing an electronic circuit module, wherein the electronic part is a semiconductor device.

DETAILED DESCRIPTION OF THE EMBODIMENT

The present embodiment may provide a method and an apparatus of manufacturing an electronic circuit module capable of solving the above-described problem and ensuring a highly reliable electrical connection between electronic parts and an interconnect substrate, and a method and an apparatus of manufacturing a semiconductor module.

(1) A method of manufacturing an electronic circuit module according to the present embodiment comprises:

flow soldering which comprises preheating an interconnect substrate on which an electronic part is placed, and supplying molten solder to a first surface of the interconnect substrate, whereby the first surface is heated to a specific temperature, wherein the interconnect substrate is heated by the preheating so that a difference between a temperature of the first surface immediately before supplying the molten solder and the specific temperature at the time of supplying the molten solder is 100° C. or less.

According to this embodiment, the change in the temperature of the interconnect substrate instantaneously caused by supplying the molten solder can be limited to 100° C. or less. If the instantaneous increase in the temperature is 100° C. or less, warping of the interconnect substrate scarcely occurs. Therefore, deterioration or destruction of an electrical connection section between an electronic part and an interconnect substrate can be reduced.

(2) In this method of manufacturing an electronic circuit module, the interconnect substrate may be heated by the preheating so that a difference between a temperature of the first surface immediately before supplying the molten solder and the specific temperature at the time of supplying the molten solder is 20° C. or less.

This enables the increase in the temperature of the interconnect substrate caused by supplying the molten solder to be limited to at least 20° C. or less, whereby warping of the interconnect substrate can be decreased more effectively.

(3) In this method of manufacturing an electronic circuit module, a temperature increase rate α of the first surface of the interconnect substrate during the preheating may be $$0 < \alpha \leq 125 (°\text{ C./sec}).$$

This enables the interconnect substrate to be heated to such an extent that warping which causes deterioration of the quality of the interconnect substrate does not occur.

(4) In this method of manufacturing an electronic circuit module, the interconnect substrate may be heated using at least either a hot blast or radiant heat during the preheating.

(5) This method of manufacturing an electronic circuit module may further comprise heating a second surface of the interconnect substrate in the step of supplying the molten solder.

According to this feature, even if the temperature of the first surface is increased by supplying the molten solder, the second surface of the interconnect substrate is heated at the same time. Therefore, a difference in the temperature between the two surfaces of the interconnect substrate can be decreased. This enables warping of the interconnect substrate to be further decreased.

(6) In this method of manufacturing an electronic circuit module, the interconnect substrate may be heated so that a difference between a temperature of the first surface of the interconnect substrate and the temperature of the second surface of the interconnect substrate is 140° C. or less.

If a difference in the temperature between the two surfaces of the interconnect substrate is 140° C. or less, the interconnect substrate can be heated to such an extent that warping which causes deterioration of the quality of the interconnect substrate does not occur.

(7) In this method of manufacturing an electronic circuit module, the temperature of the interconnect substrate may be detected and a heating temperature of the interconnect substrate may be controlled based on a detected result.

According to this feature, since the heating temperature of the interconnect substrate is controlled based on a detected result of the temperature of the interconnect substrate, the temperature can be managed precisely.

(8) In this method of manufacturing an electronic circuit module, the temperature of the second surface of the interconnect substrate may be detected while the temperature of the first surface of the interconnect substrate is detected and a heating temperature of the interconnect substrate may be controlled based on a value obtained by comparing detected results of both surfaces.

According to this feature, since the temperatures of both surfaces of the interconnect substrate are detected and the detected results are compared, the temperature can be managed precisely so that the difference in temperature between the two surfaces is maintained within a specific range.

(9) A method of manufacturing a semiconductor module according to the present embodiment comprises the above method of manufacturing an electronic circuit module, wherein the electronic part is a semiconductor device.

(10) An apparatus of manufacturing an electronic circuit module according to the present embodiment comprises:

a preheating section which includes a heater for heating an interconnect substrate on which an electronic part is placed, and a solder supplying section which supplies molten solder to a first surface of the interconnect substrate, whereby the first surface is heated to a specific temperature, wherein the heater heats the interconnect substrate so that a difference between a temperature of the first surface immediately before supplying the molten solder and the specific temperature at a time of supplying the molten solder is 100° C. or less.

According to this embodiment, the change in the temperature of the interconnect substrate instantaneously caused by supplying the molten solder can be limited to 100° C. or less. If the instantaneous increase in the temperature is 100° C. or less, warping of the interconnect substrate scarcely occurs. Therefore, deterioration or destruction of an electrical connection section between an electronic part and an interconnect substrate can be reduced.

(11) In this apparatus of manufacturing an electronic circuit module, the heater may heat the interconnect substrate so that a difference between a temperature of the first surface immediately before supplying the molten solder and the specific temperature at a time of supplying the molten solder is 20° C. or less.

This enables the increase in the temperature of the interconnect substrate caused by supplying the molten solder to be limited to at least 20° C. or less, whereby warping of the interconnect substrate can be reduced more effectively.

(12) In this apparatus of manufacturing an electronic circuit module, the heater may be disposed at least on the first surface of the interconnect substrate, wherein the heater is disposed at least on a side of the first surface of the interconnect substrate, wherein the temperature increase rate α of the first surface of the interconnect substrate is $$0<\alpha\leq125(°C./sec).$$

This enables the interconnect substrate to be heated to such an extent that warping which causes deterioration of the quality of the interconnect substrate does not occur.

(13) In this apparatus of manufacturing an electronic circuit module, the heater may be a sheath heater.

(14) In this apparatus of manufacturing an electronic circuit module, the heater may be a far infrared heater.

(15) In this apparatus of manufacturing an electronic circuit module, the heater may be equipped with a fan.

(16) In this apparatus of manufacturing an electronic circuit module, a blowing section of a hot blast from the heater may be provided on a side of the first surface of the interconnect substrate in the preheating section.

According to this feature, even if sufficient space for providing a heater cannot be secured near the interconnect substrate in the preheating section, the interconnect substrate can be heated by a heater remotely placed from the substrate.

(17) In this apparatus of manufacturing an electronic circuit module, the solder supplying section may comprise:

a solder supplying part disposed on a side of the first surface of the interconnect substrate, and a second heater disposed on a side of a second surface of the interconnect substrate.

According to this feature, even if the temperature of the first surface is increased by supplying the molten solder, the second surface of the interconnect substrate is heated at the same time. Therefore, the difference in temperature between the two surfaces of the interconnect substrate can be decreased. This enables warping of the interconnect substrate to be further decreased.

(18) In this apparatus of manufacturing an electronic circuit module, at least either the heater or the second heater may heat the interconnect substrate so that a difference between the temperature of the first surface of the interconnect substrate and the temperature of the second surface of the interconnect substrate is 140° C. or less.

If the difference in the temperature between the two surfaces of the interconnect substrate is 140° C. or less, the interconnect substrate can be heated to such an extent that warping which causes deterioration of the quality of the interconnect substrate does not occur.

(19) This apparatus of manufacturing an electronic circuit module may further comprise:

a sensor which detects a temperature of the interconnect substrate, and a heater control section which controls the temperature of at least either the heater or the second heater for heating the interconnect substrate based on a result detected by the sensor.

According to this feature, since the heating temperature of the interconnect substrate is controlled based on a detected result of the temperature of the interconnect substrate, the temperature can be managed precisely.

(20) This apparatus of manufacturing an electronic circuit module may comprise:

a first sensor which detects the temperature of the first surface of the interconnect substrate, a second sensor which detects the temperature of the second surface of the interconnect substrate, and a heater control section which controls the temperature of at least either the heater or the second heater for heating the interconnect substrate by comparing detected results of the first and second sensors.

According to this feature, since the temperatures of both surfaces of the interconnect substrate are detected and the detected results are compared, the temperature can be managed precisely so that a difference in the temperature between the two surfaces is maintained within a specific range.

(21) An apparatus of manufacturing a semiconductor module according to the present embodiment comprises the above apparatus of manufacturing an electronic circuit module, wherein the electronic part is a semiconductor device.

The embodiments of the present invention are described below with reference to the drawings. However, the present invention is not limited to the following embodiments.

First Embodiment

Figure 1A:
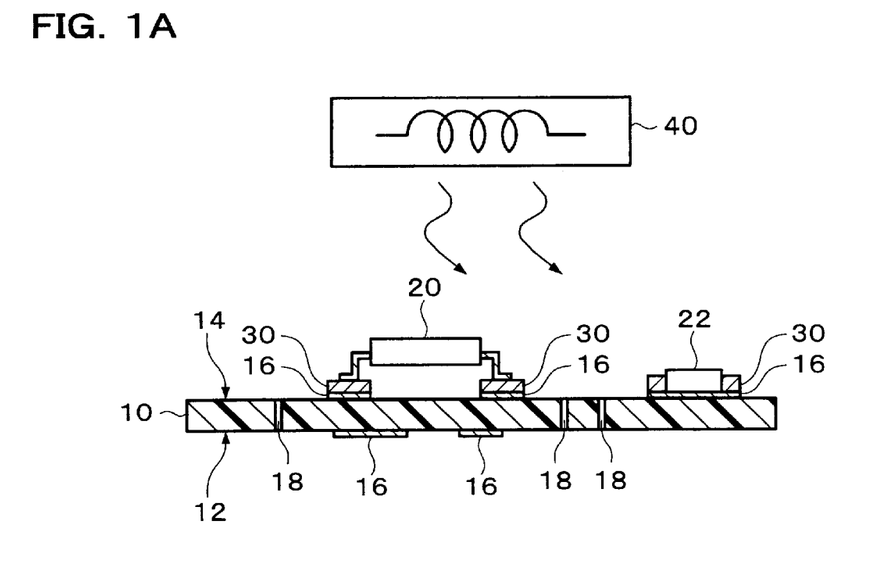
FIGS. 1A and 1B are views showing a method of manufacturing an electronic circuit module according to a first embodiment to which the present invention is applied.
Figure 1B:
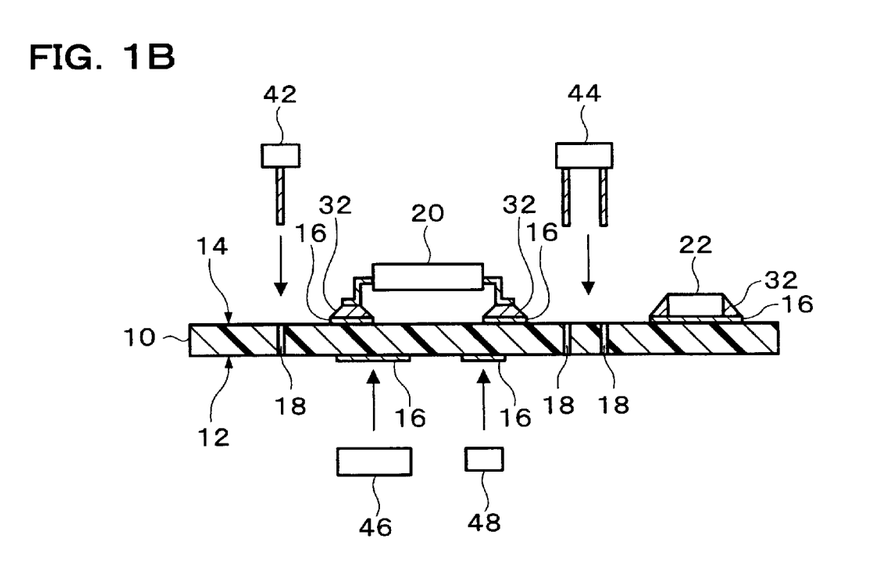
Figure 2:
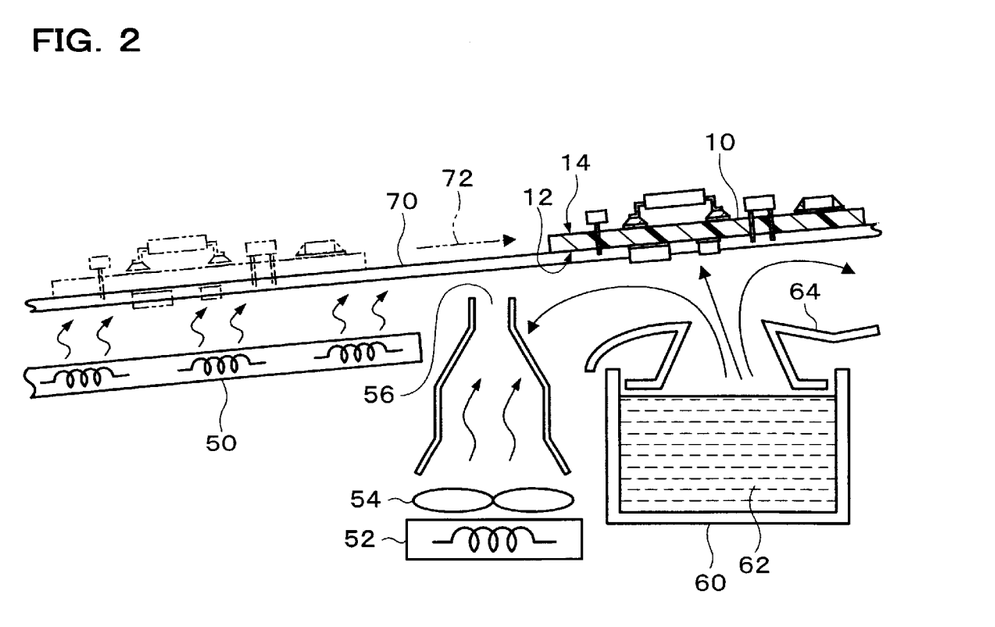
FIG. 2 is a view showing the method and an apparatus of manufacturing an electronic circuit module according to the first embodiment to which the present invention is applied.

FIGS. 1A to 2 are views illustrating a method and an apparatus of manufacturing an electronic circuit module according to a first embodiment to which the present invention is applied. In the present embodiment, first electronic parts 20 and 22 are bonded to a second surface 14 of an interconnect substrate 10, and second electronic parts 42, 44, 46, and 48 are bonded to the interconnect substrate 10 thereafter by supplying molten solder to a first surface 12.

FIGS. 1A and 1B are views showing a step of bonding the first electronic parts 20 and 22 to the interconnect substrate 10. In the example shown in the figures, the first electronic parts 20 and 22 are mounted using reflow soldering. The first electronic parts 20 and 22 may be mounted using soldering by hand, or a combination of reflow soldering and hand soldering.

As the interconnect substrate 10, a conventional substrate may be used. The interconnect substrate 10 is an organic or inorganic substrate on which interconnect patterns 16 are formed. The interconnect substrate 10 may be referred to as a circuit substrate or a printed wiring board (PWB). The interconnect substrate 10 is provided with various types of electronic parts mounted thereon and installed in electronic equipment. The interconnect substrate 10 may be either a rigid substrate or a flexible substrate, which may be either a single-layer substrate or a multi-layer substrate.

The interconnect substrate 10 has the second surface 14 and the first surface 12 opposite thereto. Through-holes 18 may optionally be formed through the first and second surfaces 12 and 14 of the interconnect substrate 10. Part of the interconnect patterns 16 (not shown) is formed in the through-holes 18. Leads of through-hole type electronic parts are inserted into the through-holes 18.

Solder 30 is applied to the second surface 14 of the interconnect substrate 10. The solder 30 may be applied to lands of the interconnect patterns 16. The first electronic parts 20 and 22 are soldered onto the interconnect patterns 16. As the solder 30, solder containing no lead (lead-free solder) may be used. A material containing tin may be used for the lead-free solder. The lead-free solder may be formed of a material containing at least one of silver, copper, zinc, and bismuth in addition to tin. The solder 30 is supplied in an appropriate amount using printing or the like.

The first electronic parts 20 and 22 are mounted on the second surface 14 of the interconnect substrate 10 using the solder 30. The first electronic parts 20 and 22 are generally surface-mount type electronic parts (SMD). The surface-mount type electronic parts are generally bonded to the interconnect substrate 10 using reflow soldering. The first electronic parts 20 and 22 include electronic devices such as an active device or passive device. The first electronic parts 20 and 22 may be manufactured by packaging electronic devices. As examples of the first electronic parts 20 and 22, semiconductor devices, resistors, capacitors, coils, oscillators, filters, thermosensors, thermistors, varistors, variable resistors, fuses, and the like can be given. In the example shown in FIG. 1A, the first electronic part 20 is a QFP-type semiconductor device.

The second surface 14 on which the first electronic parts 20 and 22 are mounted is subjected to a reflow step. Specifically, the interconnect substrate 10 is placed in a furnace equipped with a heater 40. The heater 40 is generally disposed on the side of the second surface 14 of the interconnect substrate 10. The reflow step may be performed using a conventional method.

The solder 30 is melted during the reflow step, whereby the first electronic parts 20 and 22 are bonded to the interconnect patterns 16 on the second surface 14, as shown in FIG. 1B. In more detail, connection sections 32 are formed between external terminals (leads, for example) of the first electronic parts 20 and 22 and the interconnect patterns 16, through which the external terminals and the interconnect patterns 16 are electrically connected, as shown in the figure.

The second electronic parts 42 to 48 are mounted on the interconnect substrate 10. The second electronic parts 42 to 48 may be mounted on either the second surface 14 or the first surface 12 of the interconnect substrate 10. The second electronic parts 42 to 48 may be either the surface-mount type or through-hole type. The through-hole type second electronic parts (THD) 42 and 44 are mounted on the second surface 14 of the interconnect substrate 10. The surface-mount type second electronic parts (SMD) 46 and 48 are mounted on the first surface 12 of the interconnect substrate 10. The through-hole type second electronic parts 42 and 44 are secured by inserting the leads into the through-holes 18. The surface-mount type second electronic parts 46 and 48 are bonded to the first surface 12 using an adhesive (not shown). The second electronic parts 42 and 44 may be provided after bonding the second electronic parts 46 and 48 to the interconnect substrate 10.

Molten solder 62 is supplied to the first surface 12 of the interconnect substrate 10, as shown in FIG. 2. Specifically, the second electronic parts 42 to 48 are flow soldered. This step may be performed using a manufacturing apparatus shown in the figure.

This manufacturing apparatus includes a preheating section provided with heaters 50 and 52, and a solder supplying section for supplying the molten solder 62. The interconnect substrate 10 is transferred in a direction 72 from the preheating section to the solder supplying section by a transfer means 70 which passes each section.

The number of heaters in the preheating section may be one or more. In the example shown in the figure, a plurality of heaters 50 and 52 is provided. The heaters 50 and 52 preheat the interconnect substrate 10. For example, the heaters 50 and 52 may be disposed along the first surface 12 of the interconnect substrate 10. Preheating the interconnect substrate 10 can prevent the temperature of the first surface 12 of the interconnect substrate 10 from increasing instantaneously to a large extent in the next solder supplying section.

The solder supplying section includes a solder supplying part 60 which contains the molten solder 62. The solder supplying part 60 is disposed along the first surface 12 of the interconnect substrate 10, and supplies the molten solder 62 to the first surface 12. The solder supplying part 60 may be either a stationary type solder tank or a jet flow type solder tank. Specifically, the flow soldering may be either dip soldering or jet flow soldering. In the case of using jet flow soldering, the molten solder 62 in the solder supplying part 60 is pressurized using a pump (not shown) and jetted toward the interconnect substrate 10 according to the shape of a nozzle 64. The molten solder 62 may be either solder containing lead or solder containing no lead. When the molten solder 62 is supplied to the first surface 12 of the interconnect substrate 10, the temperature of the first surface 12 is increased instantaneously (at a rate of 185° C./sec, for example).

The heaters 50 and 52 heat the interconnect substrate 10 so that the difference between the temperature of the first surface 12 immediately before supplying the molten solder 62 and the temperature of the first surface 12 at the time of supplying the molten solder 62 is 100° C. or less. The temperature of the first surface 12 immediately before supplying the molten solder 62 may be either lower or higher than the temperature of the first surface 12 at the time of supplying the molten solder 62. This enables the change in the temperature of the interconnect substrate 10 instantaneously caused by supplying the molten solder 62 to be 100° C. or less. Specifically, if the difference in the temperature is 100° C., the amount of warping of the interconnect substrate 10 can be decreased in the same manner as in the case where the difference in the temperature is smaller (50° C., for example). The interconnect substrate 10 is warped significantly when the temperature difference exceeds 100° C. For example, in the case where the temperature of the first surface 12 at the time of supplying the molten solder 62 is about 250° C., the temperature of the first surface 12 immediately before supplying the molten solder 62 may be about 150 to 250° C.

The heaters 50 and 52 may heat the interconnect substrate 10 so that the difference between the temperature of the first surface 12 immediately before supplying the molten solder 62 and the temperature of the first surface 12 at the time of supplying the molten solder 62 is 20° C. or less. The heaters 50 and 52 may heat the interconnect substrate 10 so that there is almost no difference between these temperatures. This enables the change in the temperature of the interconnect substrate 10 instantaneously caused by supplying the molten solder 62 to be limited to at least 20° C. or less (within the range of error of apparatus), whereby the amount of warping of the interconnect substrate 10 can be decreased more effectively.

The heaters 50 and 52 may heat the interconnect substrate 10 so that the temperature increase rate of the first surface 12 of the interconnect substrate 10 is $0 < \alpha \leq 125$(° C./sec). The temperature increase rate $\alpha$ (° C./sec) and the amount of warping d (mm) of the interconnect substrate 10 have the following relation.

$\alpha=50$, d=0.15

$\alpha=75$, d=0.16

$\alpha=100$, d=0.18

$\alpha=125$, d=0.20

$\alpha=150$, d=0.45

$\alpha=200$, d=0.50

From the above relation, if the temperature increase rate is 125° C./sec, the amount of warping of the interconnect substrate 10 can be decreased almost in the same manner as in the case where the temperature is increased more slowly (temperature increase rate of 100° C./sec, for example). On the contrary, in the case where the temperature increase rate exceeds 125° C./sec (temperature increase rate of 150° C./sec, for example), the interconnect substrate 10 is significantly warped. Therefore, the interconnect substrate 10 can be preheated to such an extent that warping, which causes deterioration of the quality of the interconnect substrate 10 (such as delamination of electronic parts), does not occur by limiting the temperature increase rate $\alpha$ within the above range. The temperature of the first surface 12 of the interconnect substrate 10 may be increased at either a constant rate or a variable rate.

The temperature of the heaters 50 and 52 for heating the interconnect substrate 10 may be set so as to be changed at a plurality of positions in the preheating section along the transfer direction 72. For example, the heating temperature of the interconnect substrate 10 may be increased as the interconnect substrate 10 approaches the solder supplying section. The interconnect substrate 10 may be heated at a uniform temperature at each of a plurality of positions.

The heaters 50 and 52 preferably heat the interconnect substrate 10 until immediately before supplying the molten solder 62 to the interconnect substrate 10. Specifically, the heater (heater 52 in FIG. 2) is preferably provided in the preheating section so as to be present near the solder supplying section.

In the example shown in the figure, the heater 52 is disposed between the heater 50 and the solder supplying part 60. The heater 52 may heat the interconnect substrate 10 using a hot blast. In this case, the heater 52 may be provided with a fan 54. The heater 52 has a blowing section 56 which blows a hot blast against the interconnect substrate 10. This enables the interconnect substrate 10 to be heated efficiently even if it is necessary to provide the heater 52 at a certain interval from the interconnect substrate 10. Specifically, even if sufficient space cannot be secured for providing the heater near the transfer means 70, the interconnect substrate 10 can be heated until immediately before supplying the molten solder 62 to the interconnect substrate 10.

The heating structure of the heaters 50 and 52 is not limited to that described above. For example, the heaters 50 and 52 may be infrared heaters (including far infrared heaters). There are no specific limitations to the structure of the infrared heater insofar as the heater utilizes infrared radiation (including far infrared radiation). The heaters 50 and 52 may be sheath heaters or coil heaters. The heaters 50 and 52 may be equipped with a fan. In the case of using a plurality of heaters 50 and 52, heaters having different structures may be used in combination. The heating method may be a method using radiant heat of far infrared radiation or the like, a method using a hot blast, a combination of these, or the like. In the case of using radiant heat, the interconnect substrate 10 can be heated efficiently by selecting heat rays having a wavelength suitable for the object to be heated (interconnect substrate 10).

According to the method of manufacturing an electronic circuit module according to the present embodiment, the change in temperature of the interconnect substrate 10 instantaneously caused by supplying the molten solder 62 can be limited to at least 100° C. or less. If the instantaneous increase in temperature is 100° C. or less, warping of the interconnect substrate 10 scarcely occurs. Therefore, deterioration of or damage to the electrical connection sections 32 between the first electronic parts 20 and 22 and the interconnect substrate 10 can be prevented. The structure and effects of the apparatus of manufacturing an electronic circuit module according to the present embodiment are the same as described above.

Second Embodiment

Figure 3:
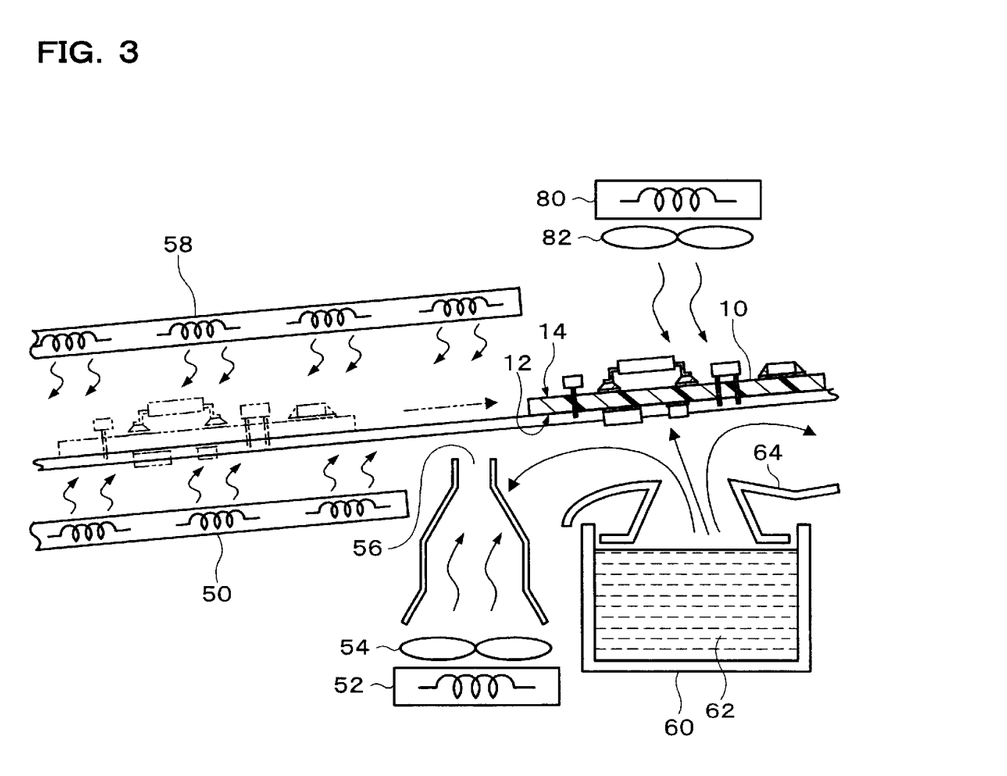
FIG. 3 is a view showing a method and an apparatus of manufacturing an electronic circuit module according to a second embodiment to which the present invention is applied.
Figure 4:
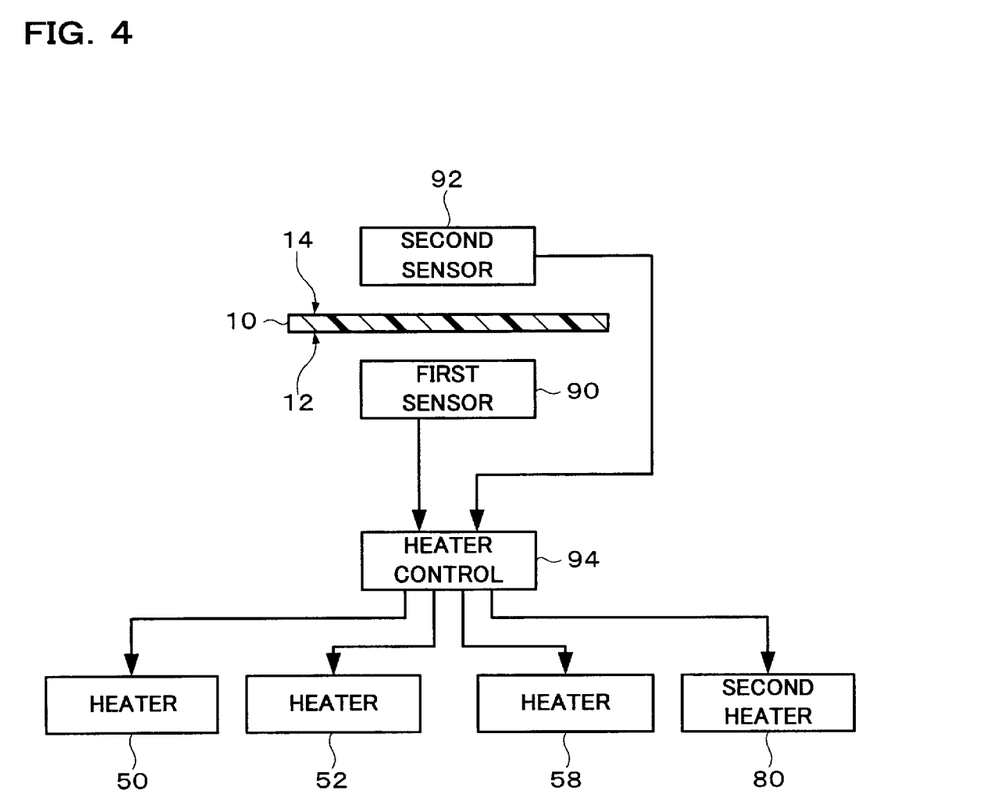
FIG. 4 is a view showing the apparatus of manufacturing an electronic circuit module according to the second embodiment to which the present invention is applied.

FIGS. 3 to 4 are views illustrating a method and an apparatus of manufacturing an electronic circuit module according to a second embodiment to which the present invention is applied. The content described in the first embodiment is applied to the present embodiment as far as possible. In FIG. 4, electronic parts mounted on the interconnect substrate 10 are omitted.

In the present embodiment, the second surface 14 of the interconnect substrate 10 is heated when supplying the molten solder 62. According to this feature, even if the first surface 12 is heated to a high temperature by supplying the molten solder 62, the second surface 14 is heated at the same time. Therefore, the difference in temperature between the first and second surfaces can be decreased. Specifically, the amount of warping of the interconnect substrate 10 can be decreased more effectively by decreasing the difference in temperature between the first and second surfaces 12 and 14.

The interconnect substrate 10 may be heated so that the difference in temperature between the second surface 14 and the first surface 12 is 140° C. or less. In more detail, the difference in temperature between the second surface 14 and the first surface 12 may be set at 140° C. or less by heating the second surface 14 when supplying the molten solder 62. The difference in temperature may be set at 140° C. or less by heating the interconnect substrate 10 not only when supplying the molten solder 62, but also during preheating. In this case, not only the first surface 12, but also the second surface 14 of the interconnect substrate 10 are heated.

The difference $\beta$(° C./sec) in the temperature increase rate between the first and second surfaces 12 and 14 and the amount of warping d (mm) of the interconnect substrate 10 have the following relation.

$\beta$=40, d=0.13

$\beta$=50, d=0.14

$\beta$=75, d=0.14

$\beta$=100, d=0.15

$\beta$=150, d=0.16

$\beta$=175, d=0.21

From the above relation, if the difference in the temperature increase rate is about 140° C./sec, the amount of warping of the interconnect substrate 10 can be decreased almost in the same manner as in the case where the difference is smaller (difference in temperature increase rate of 40° C./sec, for example). On the contrary, if the difference in the temperature increase rate exceeds 140° C./sec (difference in temperature increase rate of 175° C./sec, for example), the amount of warping of the interconnect substrate 10 increases comparatively. Therefore, the interconnect substrate 10 can be preheated and the molten solder can be supplied to such an extent that warping, which causes deterioration of the quality of the interconnect substrate 10 (such as delamination of electronic parts), does not occur by limiting the difference $\beta$ in the temperature increase rate within the above range.

The apparatus of manufacturing an electronic circuit module according to the present embodiment further includes a second heater 80 in the solder supplying section provided along the second surface 14 of the interconnect substrate 10. A heater 58 may also be provided in the preheating section along the second surface 14 of the interconnect substrate 10. This enables the difference in temperature between the first and second surfaces 12 and 14 to be decreased during preheating. The structure and heating method of the above heaters may be applied to the heater 58 and the second heater 80. For example, the heater 80 may be equipped with a fan 82.

The temperature of the interconnect substrate 10 may be detected and the heating temperature of the interconnect substrate 10 may be controlled based on the detected results, as shown in FIG. 4. In this case, the temperature may be managed by feedback control.

In the example shown in the figure, the apparatus of manufacturing an electronic circuit module includes a first sensor 90 for detecting the temperature of the first surface 12 of the interconnect substrate 10, and a second sensor 92 for detecting the temperature of the second surface 14. The temperature on the respective surfaces of the interconnect substrate 10 is detected using the first and second sensors 90 and 92. The detected results are sent to a heater control section 94 for controlling the heating temperature of the heaters. For example, the first and second sensors 90 and 92 may convert the detected temperature into electrical signals and send the signals to the heater control section 94. The temperatures of the first and second surfaces 12 and 14 of the interconnect substrate 10 may be detected using only one sensor.

The first and second sensors 90 and 92 may detect the temperature of the interconnect substrate 10 by either contacting or not contacting the interconnect substrate 10. In the latter case, the first and second sensors 90 and 92 may detect the temperature by recognizing the images of the interconnect substrate 10 and analyzing the image data. For example, the first and second sensors 90 and 92 may be thermographs.

The heater control section 94 controls the heating temperature of at least one of the heaters 50, 52, and 58 and the second heater 80 based on the signals sent from the sensors 90 and 92. For example, in the case where the temperature of the first surface 12 does not reach the target temperature, the heating temperatures of the heaters 50 and 52 for heating the first surface 12 are increased so that the temperature of the first surface 12 reaches the target temperature. This enables the temperatures of the first and second surfaces 12 and 14 of the interconnect substrate 10 to be managed precisely.

The temperature of the first surface 12 detected by the first sensor 90 and the temperature of the second surface 14 detected by the second sensor 92 may be compared, and the heating temperature of each heater may be controlled based on the difference between these temperatures, for example. In this case, the heater control section 94 may include a data processing section (not shown) for automatically calculating the data detected by the first and second sensors 90 and 92. This enables the temperature to be managed precisely so that the difference in temperature between the first and second surfaces 12 and 14 of the interconnect substrate 10 is maintained within the specific range.

The temperature of the interconnect substrate 10 is optimized as described above. The optimized data is preferably stored in the heater control section 94. In this case, the heater control section 94 includes a storage section (not shown). The heating temperature of each heater may be controlled based on the data stored in the storage section in the heater control section 94 when manufacturing electronic circuit modules thereafter.

According to the present embodiment, the effects described in the first embodiment can also be achieved.

The electronic parts may be semiconductor devices. For example, at least one of a plurality of first electronic parts (electronic part 20, for example) may be a semiconductor device. The semiconductor device may be either the surface-mount type or through-hole type. In case of using a surface-mount type semiconductor device, the semiconductor device may be mounted using leads of a lead frame of a QFP-type semiconductor device as electrodes, or using bumps (solder balls) of a BGA-type or CSP-type semiconductor device as electrodes.

A semiconductor module may be manufactured by mounting the semiconductor device on the interconnect substrate 10. Specifically, the above-described content may be applied to a method and an apparatus of manufacturing a semiconductor module. In such cases, effects the same as described above can be achieved.

What is claimed is:

1. An apparatus of manufacturing an electronic circuit module comprising:
   a preheating section which includes a heater for heating an interconnect substrate on which an electronic part is placed;
   a solder supplying section which supplies molten solder to a first surface of the interconnect substrate, whereby the first surface is heated to a specific temperature;
   a sensor to detect a temperature of the interconnect substrate; and
   a heater control section to control the heater based on a result detected by the sensor,
   wherein by the heater control section the heater is controlled to heat the interconnect substrate so that a difference between a temperature of the first surface immediately before supplying the molten solder and the specific temperature at a time of supplying the molten solder is 100° C. or less.

2. The apparatus of manufacturing an electronic circuit module as defined in claim 1,
   wherein the heater heats the interconnect substrate so that a difference between a temperature of the first surface immediately before supplying the molten solder and the specific temperature at a time of supplying the molten solder is 20° C. or less.

3. The apparatus of manufacturing an electronic circuit module as defined in claim 1,
   wherein the heater is disposed at least on a side of the first surface of the interconnect substrate,
   wherein the temperature increase rate α of the first surface of the interconnect substrate is $0 < \alpha \leq 125$(° C./sec).

4. The apparatus of manufacturing an electronic circuit module as defined in claim 1,
   wherein the heater is a sheath heater.

5. The apparatus of manufacturing an electronic circuit module as defined in claim 1,
   wherein the heater is a far infrared heater.

6. The apparatus of manufacturing an electronic circuit module as defined in claim 1,
   wherein the heater is equipped with a fan.

7. The apparatus of manufacturing an electronic circuit module as defined in claim 6,
   wherein a blowing section of a hot blast from the heater is provided on a side of the first surface of the interconnect substrate in the preheating section.

8. An apparatus of manufacturing a semiconductor module comprising:
   the apparatus of manufacturing an electronic circuit module as defined in claim 1,
   wherein the electronic part is a semiconductor device.

9. An apparatus of manufacturing an electronic circuit module comprising:
   a preheating section which includes a heater for heating an interconnect substrate on which an electronic part is placed, and
   a solder supplying section which supplies molten solder to a first surface of the interconnect substrate, whereby the first surface is heated to a specific temperature,
   wherein the heater heats the interconnect substrate so that a difference between a temperature of the first surface immediately before supplying the molten solder and the specific temperature at a time of supplying the molten solder is 100° C. or less,
   wherein the solder supplying section comprises:
      a solder supplying part disposed on a side of the first surface of the interconnect substrate, and
      a second heater disposed on a side of a second surface of the interconnect substrate.

10. The apparatus of manufacturing an electronic circuit module as defined in claim 9,
    wherein at least either the heater or the second heater heats the interconnect substrate so that a difference between a temperature of the first surface of the interconnect substrate and the temperature of the second surface of the interconnect substrate is 140° C. or less.

11. The apparatus of manufacturing an electronic circuit module as defined in claim 10, comprising:
    a first sensor which detects the temperature of the first surface of the interconnect substrate,
    a second sensor which detects the temperature of the second surface of the interconnect substrate, and
    a heater control section which controls the temperature of at least either the heater or the second heater for heating the interconnect substrate by comparing detected results of the first and second sensors.

12. The apparatus of manufacturing an electronic circuit module as defined in claim 9, further comprising:
    a sensor which detects a temperature of the interconnect substrate, and
    a heater control section which controls the temperature of at least either the heater or the second heater for heating the interconnect substrate based on a result detected by the sensor.

* * * * *